Feb. 8, 1966 D. CORDERO 3,234,405

PLURAL ELECTRODE COMPOSITE CONSTANT CURRENT-GAIN TRANSISTOR FOR LOGIC CIRCUIT

Filed April 23, 1963 3 Sheets-Sheet 1

INVENTOR.
DIOGENES CORDERO,

BY HIS ATTORNEYS.
Spensley & Horn.

DIOGENES CORDERO,
INVENTOR.

BY HIS ATTORNEYS

Spensley & Horn.

DIOGENES CORDERO,
INVENTOR.

By HIS ATTORNEYS
Spensley & Horn.

United States Patent Office 3,234,405

Patented Feb. 8, 1966

3,234,405

PLURAL ELECTRODE COMPOSITE CONSTANT CURRENT-GAIN TRANSISTOR FOR LOGIC CIRCUIT

Diogenes Cordero, Los Angeles, Calif., assignor to TRW Semiconductors, Inc., Los Angeles, Calif., a corporation of Delaware Filed Apr. 23, 1963, Ser. No. 274,986
11 Claims. (Cl. 307—88.5)

This invention relates to transistors and more particularly to the provision of circuitry which is electrically equivalent to a transistor and which is characterized by a current-gain which is relatively insensitive to temperature changes and radiation levels.

It is well known that many electrical parameters of transistors are sensitive to radiation and temperature larly to the provision of circuitry which is electrically changes. Of special interest is the value of $\beta$, which may be defined as the ratio of the collector current to the base current for either small signal A.C. or large signal D.C. conditions. It is often desirable to provide transistors capable of operation in a circuit over wide radiation and temperature changes in which the $\beta$ of the transistor remains substantially constant.

Prior efforts to accomplish this end have concerned themselves with altering the physical parameters of the transistors, such as the thickness of the base region.

Another technique often employed to effect $\beta$ stabilization with substantial changes in temperature has been to provide an electrical network to maintain a constant operating point on the transistor output characteristic, such as by use of a voltage divider network. One disadvantage of such a technique is the fact that a relatively large amount of power is consumed and the degree of stabilization is limited. Furthermore, this technique does not effectively serve to appreciably control the effective A.C. $\beta$ even though it does enhance the D.C. $\beta$ stabilization. These techniques have not been found to be wholly satisfactory as the results are not generally reproducible or consistent. These techniques have not resulted in sufficient $\beta$ insensitivity to temperature variation often encountered in the environment in which the circuit may be required to operate.

In view of the disadvantages of the prior art approaches, a different approach was sought which did not inherently possess the above-mentioned limitations. Thus, a transistor circuit having three external terminals comparable to the base, emitter and collector electrode terminals of an ordinary transistor was believed to offer the best solution, if such a design could be achieved. Such an approach was taken in copending patent application Serial No. 250,060, entitled, "Transistor Technology," by James L. Buie, also assigned to the present assignee. In this copending patent application there is disclosed an inverse feedback circuit design employing two transistors of identical conductivity type interconnected in such a manner as to effectively render what may be viewed as one "composite" transistor relatively insensitive to substantial changes in temperature and radiation level during operation. The present invention is directed toward such a "composite" transistor using two transistors of opposite conductivity types, and without the use of an external feedback loop.

Accordingly, it is an object of the present invention to provide the equivalent of a present art transistor which is substantially insensitive to changes in temperature and radiation level.

It is also an object of the present invention to provide the equivalent of a present art transistor having a constant current-gain.

It is another object of the present invention to provide a transistor circuit network which behaves electrically as a single prior art transistor in most respects, save that it is substantially insensitive to changes in temperature and radiation level.

It is a further object of the present invention to provide a transistor circuit network which behaves electrically as a single transistor in most respects except that the effective $\beta$ of the network is substantially insensitive to changes in temperature and radiation level.

It is yet another object of the present invention to provide a transistor circuit network of the character described which is compatible with either linear or nonlinear transistor circuits.

It is a still further object of the present invention to provide a circuit of the character described which may be readily fabricated in accordance with present art transistor technology.

It is a still further object of the present invention to provide a transistor circuit network which behaves electrically as a single transistor in most respects and wherein the effective current-gain may be made dependent in a predetermined manner upon changes in radiation and temperature.

The novel features which are believed to be characteristic of the present invention, both as to its organization and method of operation, together with further objects and advantages thereof will be better understood from the following description considered in connection with the accompanying drawings in which a presently preferred embodiment of the invention is illustrated by way of example. It is to be expressly understood, however, that the drawings are for the purpose of illustration and description only, and are not intended as a definition of the limits of the invention.

Figures 1A, 1B:
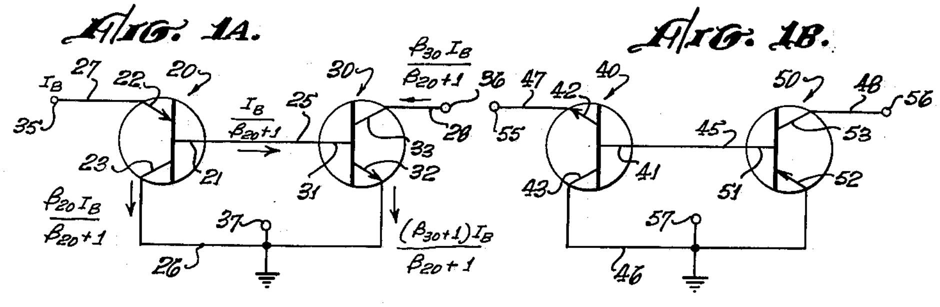
FIGURE 1 is a schematic diagram of the basic present invention circuitry, FIGURE 1A showing the basic circuitry using a PNP input transistor and an NPN output transistor, FIGURE 1B showing the basic circuitry using an NPN input transistor and a PNP output transistor.
Figure 10:
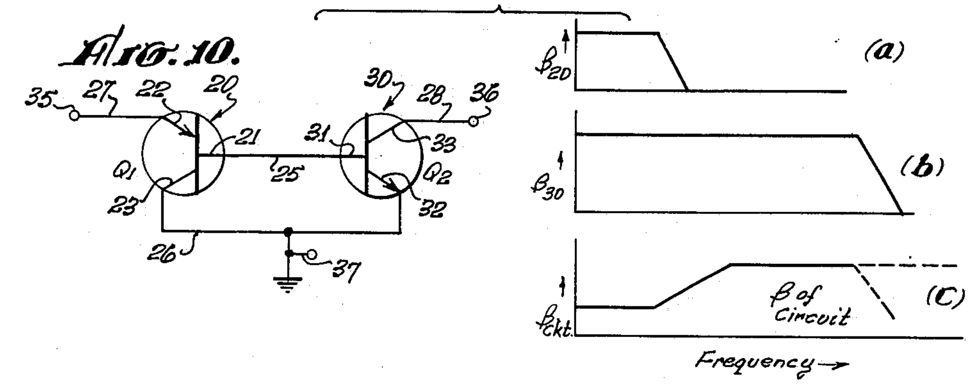
Figure 11:
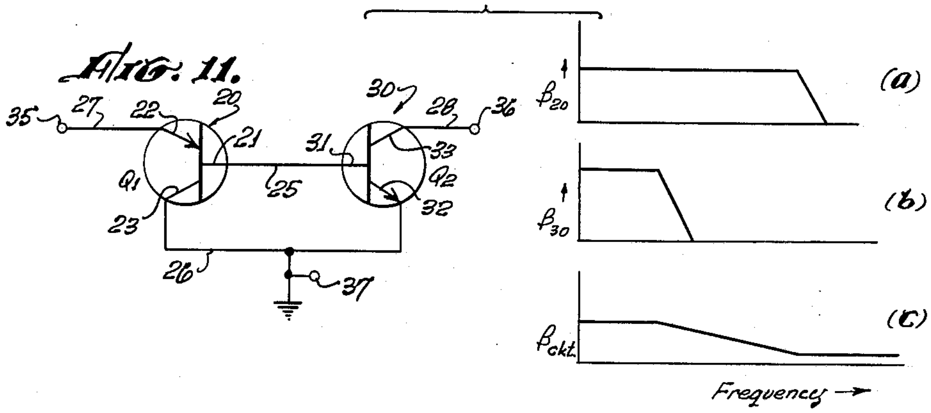
Figure 12:
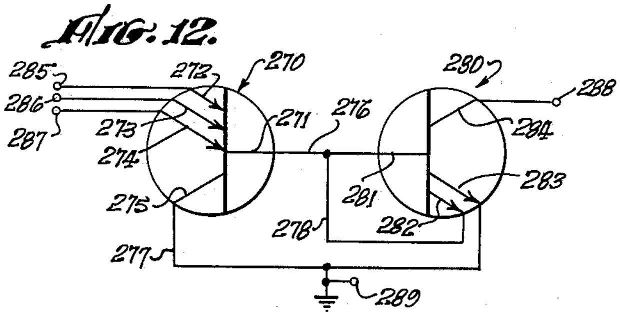

FIGURE 10 is a schematic and graphic representa tion showing how the basic circuitry of FIGURE 1A ca provide various filter functions by proper selection o transistor $\beta$, FIGURE 10($a$) showing the $\beta$ of the inpu transistor plotted as a function of frequency, FIGURI 10($b$) showing the $\beta$ of the output transistor plotted a a function of frequency, and FIGURE 10($c$) showin the overall $\beta$ plotted as a function of frequency;

FIGURE 11 is a schematic and graphic representation showing how the basic circuitry of FIGURE 1A can provide various other filter functions by proper selection of transistor $\beta$, FIGURE 11($a$) showing the $\beta$ of the input transistor plotted as a function of frequency, FIGURE 11($b$) showing the $\beta$ of the output transistor plotted as a function of frequency, and FIGURE 11($c$) showing the overall circuit $\beta$ plotted as a function of frequency; and FIGURE 12 is a schematic diagram showing the use of multiple-emitter transistors in the present invention circuitry to provide a NOR gate circuit.

Referring now to the drawings, there is shown in FIGURE 1A the schematic diagram of a first embodiment of the basic present invention circuitry utilizing a PNP transistor 20 and an NPN transistor 30. The transistor 20 will be designated as the input transistor and it includes a base electrode 21, an emitter electrode 22 and a collector electrode 23. The transistor 30 is designated as the output transistor and it includes a base electrode 31, an emitter electrode 32 and a collector electrode 33. The base electrodes 21 and 31 of the input and output transistors are interconnected by an electrical lead 25. The collector electrode 23 of the input transistor 20 is connected by an electrical lead 26 to the emitter electrode 32 of the output transistor 30, the electrical lead 26 being grounded, as shown. The emitter electrode 22 of the input transistor 20 is connected by an electrical lead 27 to an input terminal 35. The collector electrode 33 of the output transistor 30 is connected by an electrical lead 28 to an output terminal 36. A common terminal 37 is connected to the grounded electrical lead 26.

The entire circuit of FIGURE 1A may be viewed as a composite electrical translating element having an input electrode, an output electrode and a common electrode, connections to these electrodes being made through the respective input, output and common terminals 35–37. More specifically, the circuit of FIGURE 1A can be viewed as a composite NPN transistor having a base connection to terminal 35, a collector connection to terminal 36 and an emitter connection to terminal 37.

The circuit of FIGURE 1A will now be described as o its operation with major emphasis being placed upon he current-gain of the composite device. It is to be nderstood that the term "$\beta$," as used herein, is applicable ɔ both small signal A.C. and large signal D.C. conditions in the various present invention embodiments. By nterconnecting the two transistors as shown, the current-ain of the composite device will be substantially con-ant with variations in temperature and radiation level. t the present state of the art, practicality dictates that e overall circuit $\beta$ be substantially greater than unity. ence, the current-gain of the output transistor 30, identi-d by the reference notation $\beta_{30}$, should be relatively rge with respect to the $\beta$ of the input transistor 20, as entified by the reference notation $\beta_{20}$. Yet $\beta_{20}$ should larger than unity, the presently preferred range of $\beta_{20}$ ing about 5–50. The presently preferred range of $\beta_{30}$ about 50–500. Of course, other values of $\beta$ and $\beta$ re-ionships could be chosen should it be desired to provide extremely low overall circuit $\beta$.

A typical practical example of the circuit of FIG-RE 1A uses an input transistor 20 having a current-in characteristic of 20 ($\beta_{20}=20$), and an output tran-tor 30 having a current-gain characteristic of 200 $_{30}=200$). Therefore, $\beta_{30}/\beta_{20}=10$, which is also sub-ntially equal to the current gain of the composite de-e, $\beta_{ckt.}$, as will now be shown.

The input current flows through the input terminal 35 1 can be viewed as the base current, $I_B$, of the com-site device. The overall current gain of the composite ice, $\beta_{ckt.}$, can be determined with reference to the ues of current indicated on the diagram of FIG-E 1A.

The emitter current of the input transistor 20 is $I_B$, the collector current of that transistor then being $$\frac{\beta_{20}I_B}{\beta_{20}+1}$$

The base current of the input transistor 20, which is also the base current of the output transistor 30, is then $$\frac{I_B}{\beta_{20}+1}$$

The emitter current of the output transistor 30 is $$\frac{(\beta_{30}+1)I_B}{\beta_{20}+1}$$

The collector current of the output transistor 30, which is also the output current of the composite device, is $$\frac{\beta_{30}I_B}{\beta_{20}+1}$$

The current gain of the composite device then, $$\beta_{ckt.}=\frac{\beta_{30}I_B}{\beta_{20}+1}\div I_B=\frac{\beta_{30}}{\beta_{20}+1}$$

It has been found that in this present invention circuitry $\beta_{20}=\beta_{30}/K$, wherein K is a constant. And, when $\beta_{30}$ is large with respect to $\beta_{20}$, $\beta_{20}$ being substantially greater than one, the current gain of the device is substantially equal to the ratio $\beta_{30}/\beta_{20}$ and so equal to the constant, K.

In FIGURE 1B of the drawing, there is shown the basic present invention circuitry utilizing an NPN input transistor and a PNP output transistor to provide a composite PNP transistor having a constant current-gain. The NPN input transistor is identified by the reference numeral 40, and includes a base electrode 41, an emitter electrode 42 and a collector electrode 43. The PNP output transistor is identified by the reference numeral 50, and includes a base electrode 51, an emitter electrode 52 and a collector electrode 53. The base electrodes 41 and 51 of the input and output transistors are interconnected by an electrical lead 45. The collector electrode 43 of the input transistor 40 is connected by an electrical lead 46 to the emitter electrode 52 of the output transistor 50, the electrical lead 46 being grounded, as shown. The emitter electrode 42 of the input transistor 40 is connected by an electrical lead 47 to an input terminal 55. The collector electrode 53 of the output transistor 50 is connected by an electrical lead 48 to an output terminal 56. A common terminal 57 is connected to the grounded electrical lead 46. Thus, it is seen that the circuitry of FIGURE 1B is identical with that of FIGURE 1A with the exception of reversed transistor conductivity types, i.e., NPN substituted for PNP and vice versa.

The entire circuit of FIGURE 1B may be viewed as a composite PNP transistor having a base connection to terminal 55, a collector connection to terminal 56 and an emitter connection to terminal 57. The preceding discussion concerning the various transistor $\beta$ characteristics and values of current indicated on the diagram of FIGURE 1A apply with equal force to the circuitry of FIGURE 1B, the current gain of the composite device of FIGURE 1B again being equal to the constant K.

Figures 2, 4:
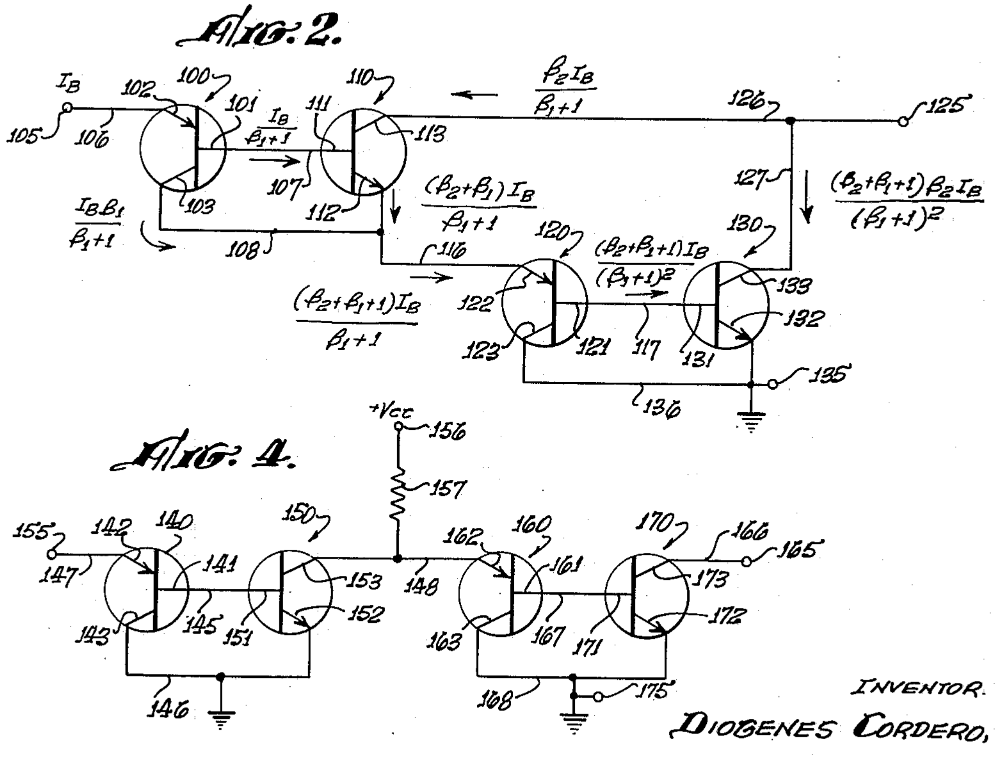
FIGURE 2 is a circuit diagram showing the basic present invention circuitry coupled in a Darlington arrangement.
FIGURES 4–6 are circuit diagrams showing various coupling methods.

In FIGURE 2 of the drawings, there is shown an adaptation of the present invention basic circuit of FIGURE 1A in a so-called "Darlington" circuit configuration. This embodiment utilizes four transistors 100, 110, 120 and 130. The transistor 100 is of the PNP type and includes a base electrode 101, an emitter electrode 102 and a collector electrode 103. The transistor 110 is of the NPN type and includes a base electrode 111, an emitter electrode 112 and a collector electrode 113. The transistor 120 is of the PNP type and includes a base electrode 121, an emitter electrode 122 and a collector electrode 123. The transistor 130 is of the NPN type and includes a base electrode 131, an emitter electrode 132 and a collector electrode 133.

The emitter electrode 102 of the transistor 100 is connected to an input terminal 105 by an electrical lead 106. The base electrodes 101 and 111 of the transistors 100 and 110 are interconnected by an electrical lead 107. The collector electrode 103 of the transistor 100 is connected by an electrical lead 108 to the emitter electrode 112 of the transistor 110, the emitter electrode 112 also being connected to the emitter electrode 122 of the transistor 120 by an electrical lead 116.

The base electrodes 121 and 131 of the transistors 120 and 130 are interconnected by an electrical lead 117. The collector electrode 113 of the transistor 110 is connected to an output terminal 125 by an electrical lead 126. The collector electrode 133 of the transistor 130 is connected by an electrical lead 127 and the electrical lead 126 to the output terminal 125. The collector electrode 123 of the transistor 120 and the emitter electrode 132 of the transisor 130 are connected to a common terminal 135 by an electrical lead 136, this common terminal being grounded, as shown.

In the circuit of FIGURE 2, transistors 100 and 110, comprising the input set of transistors, are connected in the basic manner of FIGURE 1A and, for ease of explanation only, are specified to have identical $\beta$, this $\beta$ being indicated by the reference notation $\beta_1$. Similarly, the transistors 120 and 130, comprising the output set, are specified to be of identical $\beta$, this $\beta$ being identified by the reference $\beta_2$. Viewing the circuit of FIGURE 2 as a composite Darlington circuit configuration having an input terminal 105, and output terminal 125 and a common terminal 135, the input current flowing through the input terminal 105 will be designated $I_B$ since, in a normal Darlington circuit, the input is applied to the base electrode of an input transistor. Under these specified notations for $\beta$ and input current, the diagram of FIGURE 2 is labeled to show the currents flowing in various parts of the circuit, these currents being expressed in terms of the input current $I_B$ and the $\beta$ of the input and output transistor sets, $\beta_1$ and $\beta_2$. Referring to these notations, it can be shown that the output current $I_{out}$ is:

$$I_{out}=\frac{(\beta_2+\beta_1+1)\beta_2 I_B}{(\beta_1+1)^2}+\frac{\beta_2 I_B}{\beta_1+1}=\frac{(\beta_2^2+2\beta_2\beta_1+2\beta_2)I_B}{(\beta_1+1)^2}$$

and $$\beta_{ckt.}=\frac{\beta_2^2+2\beta_2\beta_1+2\beta_2}{(\beta_1+1)^2}=\frac{I_{out}}{I_B}$$

Figure 3:
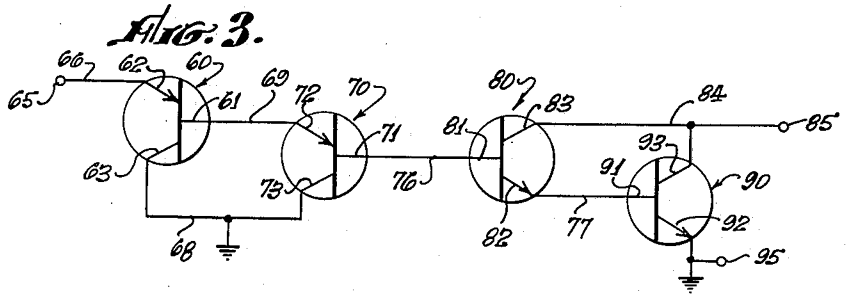
FIGURE 3 is a circuit diagram showing an alternative Darlington connection.

In FIGURE 3 of the drawing, there is shown another adaptation of the present invention basic circuitry to provide another embodiment of a Darlington circuit configuration. The circuit utilizes first and second PNP transistors 60 and 70, and third and fourth NPN transistors 80 and 90, the transistors having respective base electrodes 61, 71, 81 and 91, respective emitter electrodes 62, 72, 82 and 92, and respective collector electrodes 63, 73, 83 and 93. The emitter electrode 62 of the transistor 60 is connected to an input terminal 65 by an electrical lead 66. The collector electrodes 63 and 73 of the two PNP transistors are interconnected by an electrical lead 68, the lead 68 being grounded as shown. The base electrode 61 of the transistor 60 is connected by an electrical lead 69 to the emitter electrode 72 of the transistor 70.

The base electrodes 71 and 81 of the transistors 70 and 80 are interconnected by an electrical lead 76. The emitter electrode 82 of the transistor 80 is connected to the base electrode 91 of the transistor 90 by an electrical lead 77. The collector electrodes 83 and 93 of the transistors 80 and 90 are connected by an electrical lead 84 to an output terminal 85. The emitter electrode 92 of the transistor 90 is coupled to a grounded common terminal 95.

The entire circuit of FIGURE 3 may be viewed as a composite Darlington circuit having respective input, output and common terminals 65, 85 and 95. The current gain of the NPN output transistors should be higher than the current gain of the PNP output transistors, the presently preferred $\beta$ range for the NPN output transistors 80 and 90 being about 10–500 and the presently preferred $\beta$ range for the PNP input transistors 60 and 70 being about 5–50. Neither the PNP transistors nor the NPN transistors need be of an identical $\beta$, the overall current gain, $\beta_{ckt.}$, being substantially constant with varying temperature and radiation level throughout the stated $\beta$ ranges. For ease of explanation, in the illustrated embodiment of FIGURE 3, PNP transistors 60 and 70 having identical $\beta$ are selected, the $\beta$ of each of these transistors being indicated by the reference symbol $\beta_{60/70}$. Similarly, NPN transistors 80 and 90 having identical $\beta$ are selected, the $\beta$ of these transistors being indicated by the reference symbol $\beta_{80/90}$. By selecting PNP transistors having an identical $\beta$ and NPN transistors of identical $\beta$, the overall current gain of the circuit ($\beta_{ckt.}$) then becomes:

$$\beta_{ckt.}=\frac{\beta_{80/90}}{(\beta_{60/70}+1)^2}+\frac{\beta_{80/90}(\beta_{80/90}+1)}{(\beta_{60/70}+1)^2}=\frac{\beta_{80/90}^2+2\beta_{80/90}}{(\beta_{60/70}+1)^2}$$

or, $$\beta_{ckt.}\simeq\frac{(\beta_{80/90}+1)^2}{(\beta_{60/70}+1)^2}=\left[\frac{\beta_{80/90}+1}{\beta_{60/70}+1}\right]^2$$

Thus, it is seen that the overall circuit $\beta$ is a function of the squares of the individual transistor $\beta$ characteristics and, since the ratio of the individual transistor $\beta$ characteristics remains constant with varying temperatures and radiation level, the circuit $\beta$ is also constant.

Figures 5, 6:
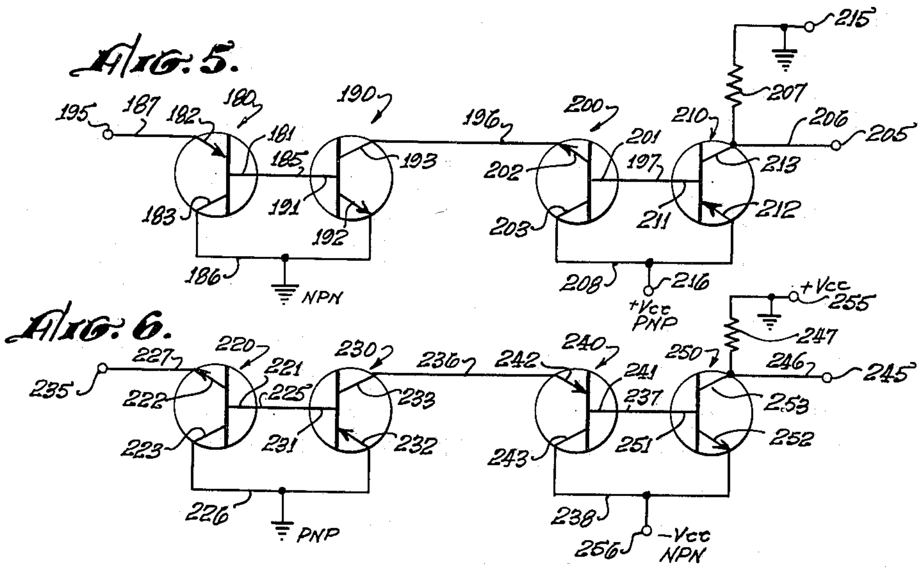

In FIGURES 4, 5 and 6 of the drawings, there are shown various combinations of the basic circuitry of FIGURES 1A and 1B interconnected to form an integrated amplifier chain. Referring specifically to FIGURE 4, there is shown an integrated amplifier chain formed by cascading two of the composite PNP transistors of FIGURE 1A. Four transistors are utilized in this embodiment, these transistors being identified by the reference numerals 140, 150, 160 and 170.

The transistor 140 is of the PNP type and includes a base electrode 141, an emitter electrode 142 and a collector electrode 143. The transistor 150 is of the NPN type and includes a base electrode 151, an emitter electrode 152 and a collector electrode 153. The transistor 160 is of the PNP type and includes a base electrode 161, an emitter electrode 162 and a collector electrode 163. The transistor 170 is of the PNP type and includes a base electrode 171, an emitter electrode 172 and a collector electrode 173.

The base electrodes 141 and 151 of the transistors 140 and 150 are interconnected by an electrical lead 145. The collector electrode 143 of the transistor 140 is connected by an electrical lead 146 to the emitter electrode 152 of the transistor 150, the electrical lead 146 being grounded, as shown. The emitter electrode 142 of the transistor 140 is connected by an electrical lead 147 to an input terminal 155. The collector electrode 153 of the transistor 150 is connected by an electrical lead 148 to the emitter electrode 162 of the transistor 160. A source of operating voltage, designated $V_{cc}$, is applied between ground and a terminal 156, the terminal 156 being coupled by a resistor 157 to the electrical lead 148 interconnecting the transistors 150 and 160.

The collector electrode 173 of the transistor 170 is connected to an output terminal 165 by an electrical lead 166. The base electrodes 161 and 171 of the transistors 160 and 170 are interconnected by an electrical lead 167. The collector electrode 163 of the transistor 160 is connected by an electrical lead 168 to the emitter electrode 172 of the transistor 170, the electrical lead 168 being grounded, as shown. A common terminal 175 is connected to the grounded electrical lead 168.

The entire circuit of FIGURE 4 may be viewed as two cascaded composite NPN transistors, the positive terminal of the operating voltage source $V_{cc}$ being connected to the terminal 156, and the negative terminal of this voltage source being grounded. Again, the constant $\beta$ characteristics of the basic circuitry of FIGURE 1A apply, thereby providing cascaded amplifier stages which are relatively insensitive to changes in temperature and radiation level.

In FIGURE 5 of the drawings, there is shown an integrated amplifier chain formed by cascading the composite PNP transistor of FIGURE 1B with the composite NPN transistor of FIGURE 1A. The four transistors utilized in this embodiment are identified by the reference numerals 180, 190, 200 and 210. The transistor 180 is of the PNP type and includes a base electrode 181, an emitter electrode 182 and a collector electrode 183. The transistor 190 is of the NPN type and includes a base electrode 191, an emitter electrode 192 and a collector electrode 193. The transistor 200 is of the NPN type and includes a base electrode 201, an emitter electrode 202 and a collector electrode 203. The transistor 210 is of the PNP type and includes a base electrode 211, an emitter electrode 212 and a collector electrode 213.

The transistors 180 and 190 form the composite NPN transistor of FIGURE 1A, the base electrodes 181 and 191 of the transistors 180 and 190 being interconnected by an electrical lead 185. The collector electrode 183 of the transistor 180 is connected by an electrical lead 186 to the emitter electrode 192 of the transistor 190, the electrical lead 186 being grounded, as shown. The emitter electrode 182 of the transistor 180 is connected by an electrical lead 187 to an input terminal 195. The collector electrode 193 of the transistor 190 is connected to the emitter electrode 202 of the transistor 200 by an electrical lead 196.

The transistors 200 and 210 form the composite PNP transistor of FIGURE 1B, the base electrodes 201 and 211 of the transistors 200 and 210 being interconnected by an electrical lead 197. The collector electrode 213 of the transistor 210 is coupled to an output terminal 205 by an electrical lead 206, the collector electrode 213 also being coupled to ground through a load resistor 207. The collector electrode 203 of the transistor 200 is coupled to the emitter electrode 212 of the transistor 210 by an electrical lead 208. A common terminal 215 is coupled to ground, as shown. A voltage input terminal 216 is coupled to the electrical lead 208, a source of operating voltage, $V_{cc}$, being connected between ground and the terminal 216. The source of operating voltage $V_{cc}$ is polarized, as shown, with its negative terminal grounded.

The circuit of FIGURE 6 is the opposite of the circuit of FIGURE 5 in that it shows an integrated amplifier chain formed by cascading the composite NPN transistor of FIGURE 1A with the composite PNP transistor of FIGURE 1B, the composite PNP transistor including transistors 220 and 230, the composite NPN transistor including transistors 240 and 250. The transistor 220 is of the NPN type and includes a base electrode 221, an emitter electrode 222 and a collector electrode 223. The transistor 230 is of the NPN type and includes a base electrode 231, an emitter electrode 232 and a collector electrode 233. The transistor 240 is of the PNP type and includes a base electrode 241, an emitter electrode 242 and a collector electrode 243. The transistor 250 is of the NPN type and includes a base electrode 251, an emitter electrode 252 and a collector electrode 253.

The transistors 220 and 230 form the composite PNP transistor of FIGURE 1B, the base electrodes 221 and 231 of the transistors 220 and 230 being interconnected by an electrical lead 225. The collector electrode 223 of the transistor 220 is interconnected by an electrical lead 226 to the emitter electrode 232 of the transistor 230, the electrical lead 226 being grounded, as shown. The emitter electrode 222 of the transistor 220 is connected by an electrical lead 227 to an input terminal 235. The collector electrode 233 of the transistor 230 is coupled by an electrical lead 236 to the emitter electrode 242 of the transistor 240.

The transistors 240 and 250 form the composite NPN transistor of FIGURE 1A, the base electrodes 241 and 251 of the transistors 240 and 250 being interconnected by an electrical lead 237. The collector electrode 243 of the transistor 240 is coupled by an electrical lead 238 to the emitter electrode 252 of the transistor 250. The collector electrode 253 of the transistor 250 is coupled to an output terminal 245 by an electrical lead 246, the collector electrode 253 being coupled to ground through a load resistor 247. A common terminal 255 is connected to ground.

A voltage input terminal 256 is conected to the electrical lead 238 and a source of operating voltage $V_{cc}$, is coupled between the terminal 256 and ground. The operating voltage source $V_{cc}$ is polarized, as shown, with its positive terminal grounded. The integrated amplifier chains of FIGURES 5 and 6 also provide the desired advantages of an overall circuit $\beta$ which is relatively insensitive to changes in temperature and radiation level.

Figure 7A:
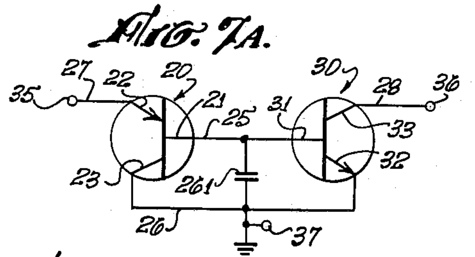
FIGURE 7 shows how the present invention circuitry can be applied as a low-pass filter, FIGURE 7A being a circuit diagram, and FIGURE 7B being a graph showing the circuit-current-gain plotted as a function of frequency.
Figure 7B:
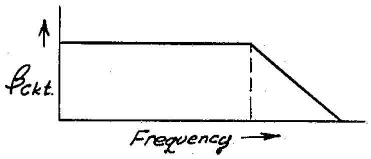
Figure 8A:
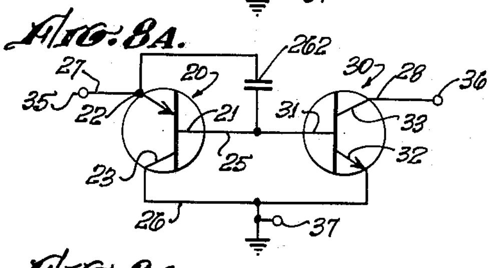
FIGURE 8 shows how the present invention circuitry can be applied as a high-pass filter, FIGURE 8A being a circuit diagram, and FIGURE 8B being a graph showing the circuit current-gain plotted as a function of frequency.
Figure 8B:
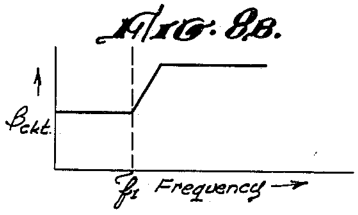
Figure 9A:
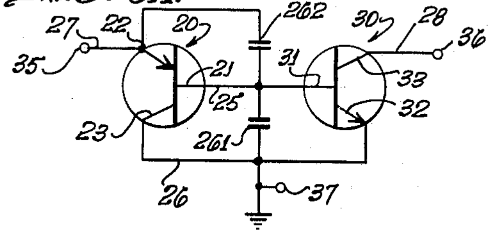
FIGURE 9 shows how the present invention circuitry can be applied as a bandpass filter, FIGURE 9A being a circuit diagram, and FIGURE 9B being a graph showing the circuit current-gain plotted as a function of frequency.

FIGURES 7, 8 and 9 of the drawings illustrate how the frequency characteristic of the current gain of the basic circuit of FIGURE 1A can be altered through the use of capacitors, to thereby provide various types of frequency responses. Referring specifically to FIGURES 7A and 7B, there is shown the basic circuit of FIGURE 1A to which a single capacitor has been added to provide a low-pass filter characteristic. For ease of explanation, like reference characters refer to identical components throughout the FIGURES 1A, 7A, 8A, 9A, 10 and 11. The desired low-pass filter characteristic is obtained in the circuitry of FIGURE 7A by the connection of a capacitor 261 between the electrical lead 25 and ground. Since the reactance of the capacitor 261 decreases with increasing frequency, it acts as a low-pass filter intercoupling the input and output transistors 20 and 30. FIGURE 7B of the drawings is a graph showing the current gain of the composite circuit, $\beta_{ckt.}$, logarithmically plotted as a function of frequency.

FIGURE 8A of the drawings shows how a capacitor can be added to the basic circuitry of FIGURE 1A to provide a high-pass filter characteristic. In this embodiment, a capacitor 262 is coupled between the emitter electrode 22 of the transistor 20 and the electrical lead 25 interconnecting the input and output transistors. Since the capacitive reactance of the capacitor 262 decreases with increasing frequency, at very low frequencies the capacitor acts as a shunt of extremely high impedance (approaching an open circuit) across the emitter and base of the transistor 20. At extremely high frequencies, on the other hand, the low impedance of the capacitor 262 approaches a short circuit across the emitter and base electrodes of the transistor 20 to directly couple input signals to the base electrode 31 of the output transistor 30. In FIGURE 8B of the drawings, the overall circuit $\beta$ of the composite device of FIGURE 8A is shown logarithmically plotted as a function of frequency.

Figure 9B:
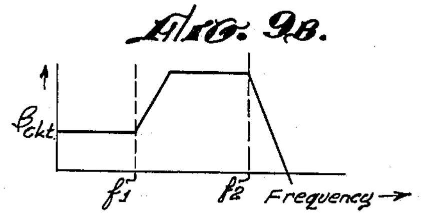

In FIGURE 9A of the drawings, there is shown the basic circuitry of FIGURE 1A to which has been added both of the capacitors 261 and 262 to thereby provide a composite circuit exhibiting a bandpass characteristic, the circuit of FIGURE 9A resulting from a combination of the circuits of FIGURES 7A and 8A. In FIGURE 9B of the drawings, the overall circuit $\beta$ of the composite transistor of FIGURE 9A is shown logarithmically plotted as a function of frequency. At extremely low frequencies, the very high impedances of the capacitors 261 and 262 result in little effect on the circuit, thereby maintaining a constant current gain. At extremely high frequencies, on the other hand, the short-circuiting effect provided by the very low impedances of the capacitors 261 and 262 results in insignificant output current from the circuit. In the intermediate frequency range, the impedances of the capacitors 261 and 262 provide varying effects upon the current-gain characteristics. Typically, the capacitance of the capacitor 261 is significantly smaller than the capacitance of the capacitor 262, in accordance with the particular bandpass characteristic desired. As the frequency of the input signals increases above a particular frequency, designated by the reference symbol $f_1$ in FIGURE 9B, the decreasing impedance of the capacitor 262 results in an increase in circuit gain in the manner shown in FIGURE 8B, the capacitor 262 acting primarily as a coupling capacitor at higher frequencies. As the frequency is increased above the frequency designated by the reference symbol $f_2$ in FIGURE 9B, the decreasing impedance of the capacitor 261 provides a shunting effect across the input of the transistor 30. As the frequency of the input increases still higher, the low impedance of the capacitor 261 effectively short circuits the input of the transistor 30, thereby resulting in an insignificant circuit output. Therefore the overall current-gain characteristic of the composite device is of the desired bandpass configuration. Although the circuits of FIGURES 7–9 illustrate various frequency characteristics attainable upon the addition of capacitors to the composite NPN transistor of FIGURE 1A, the foregoing concepts are equally applicable to the composite PNP transistor of the basic circuitry of FIGURE 1B.

Turning now to FIGURES 10 and 11 of the drawings, there are shown embodiments in which various frequency characteristics can be obtained for the composite NPN transistor of FIGURE 1A, without the use of capacitors or other external circuitry. The desired characteristics are attained by selection of the individual PNP and NPN transistors forming the composite device, the selection being made on the basis of the $\beta$ of each of the individual transistors. For example, in the circuit of FIGURE 10, a PNP input transistor 20 having the $\beta$ characteristic shown in FIGURE 10(*a*) is chosen. An NPN output transistor 30 having the $\beta$ characteristics shown in FIGURE 10(*b*) is selected, the combination of these two particular transistors giving the overall $\beta$ characteristic shown in FIGURE 10(*c*). The graphs of FIGURES 10(*a*)–(*c*) all show $\beta$ plotted as a function of frequency.

In FIGURE 11 of the drawings, there is shown another embodiment illustrating how a different current-gain characteristic can be obtained as a function of frequency for the basic NPN composite transistor of FIGURE 1A. In this circuit, an input transistor 20 having the $\beta$ characteristic $\beta_{20}$, shown in the graph of FIGURE 11(*a*), is chosen. An output transistor 30 having the $\beta$ characteristic $\beta_{30}$, shown in the graph of FIGURE 11(*b*), is selected, the combination of two such transistors providing the overall current gain, $\beta_{ckt.}$, as shown in the graph of FIGURE 11(*c*). In comparing the current-gain characteristics of the circuits of FIGURES 10 and 11, it is seen that a high-pass filter characteristic is provided in the circuit of FIGURE 10 by choosing an input transistor having a lower cutoff frequency than the $\beta$ of the output transistor, whereas in the circuit of FIGURE 11 a low-pass net characteristic is obtained by selecting an input transistor having a higher cutoff frequency than the $\beta$ of the output transistor. It will be readily apparent to those skilled in the art that different bandpass characteristics are obtainable upon proper selection of the individual transistors. Furthermore, these concepts are equally applicable to provide desired bandpass characteristics for the composite PNP transistor of the circuit of FIGURE 1B.

In FIGURE 12 of the drawings, there is illustrated an embodiment of the present invention circuitry wherein transistors of the multiple emitter type are used to provide a NOR gate circuit. The embodiment of FIGURE 12 is based upon the circuit of FIGURE 1A, substituting multiple emitter transistors for both the input and output transistors of that circuit. A discussion of the theory and operation of multiple emitter transistors may be found in copending U.S. patent application, Serial No. 136,841, filed September 8, 1961, by James L. Buie, this patent application also being assigned to the present assignee.

Referring specifically to FIGURE 12, the input transistor is of the three emitter type and is designated by the reference numeral 270, the output transistor being of the two emitter type and designated by the reference numeral 280. The multiple emitter input transistor 270 is of the PNP type and includes a base electrode 271, emitter electrodes 272–274 and a collector electrode 275. The multiple emitter output transistor 280 is of the NPN type and includes a base electrode 281, emitter electrodes 282 and 283, and a collector electrode 284. The base electrodes 271 and 281 of the transistors 270 and 280 are interconnected by an electrical lead 276. The collector electrode 275 of the transistor 270 is interconnected with the emitter electrode 283 of the transistor 280 by an electrical lead 277, the electrical lead 277 being grounded, as shown. The emitter electrodes 272, 273 and 274 are connected to respective input terminals 285, 286 and 287. The collector electrode 284 of the output transistor 280 is connected to an output terminal 288. The base electrode 281 and the emitter electrode 282 of the transistor 280 are interconnected by an electrical lead 278 to provide an anti-saturation feature, as will be further discussed hereinbelow. A common terminal 289 is connected to the grounded electrical lead 277.

A NOR gate is a multiple input logic circuit which produces an output whenever a triggering signal is impressed on any of its inputs, the polarity of the output signal being opposite to the polarity of the input signal, i.e., a NOR gate is an OR gate with phase inversion. The usual transistor logic to provide a NOR function utilizes either a plurality of transistors, the input electrode of each transistor forming one of the gate inputs, or a single transistor having its input electrode coupled to each input through a separate D.C. isolating means. In the circuit of FIGURE 12, on the other hand, all of the inputs are directly coupled to a single input transistor. Thus, the circuit of FIGURE 12 provides composite directly coupled transistor logic having an overall circuit $\beta$ which is substantially insensitive to changes in temperature and radiation level. In the circuit of FIGURE 12 the interconnection of the base electrode 281 and the emitter electrode 282 by the electrical lead 278 provides a current-regulating feedback effect which prevents deep saturation of the transistor 280, thereby reducing its storage time and so increasing circuit speed. It will be readily apparent to those skilled in the art that the present invention concepts are equally applicable to other types of transistor logic, such as AND gate circuitry, for example.

Thus there has been described composite circuitry which is electrically equivalent to an electrical translating element and which is characterized by a current gain which is relatively insensitive to temperature changes and radiation levels, various embodiments and uses of the basic circuitry being shown. Although the invention has been described with a certain degree of particularity, it is understood that the present disclosure has been made only by way of example and that numerous changes in the details of construction and the combination and arrangement of parts may be resorted to without departing from the spirit and scope of the invention as hereinafter claimed. Any transistor type presently available, with the exception of point contact devices, may be used in any of the present invention embodiments.

What is claimed is:

1. A transistor circuit forming a composite electrical translating element having an input electrode, an output electrode and a common electrode, said circuit comprising:

(a) an input transistor having a base electrode, an emitter electrode and a collector electrode, the emitter electrode of said input transistor serving as the input electrode of said composite electrical translating element;

(b) an output transistor having a base electrode, an emitter electrode and a collector electrode, said output transistor being of the opposite conductivity type from said input transistor, the collector electrodes of said output transistor serving as the output electrode of said composite electrical translating element, the base electrode of said output transistor and the base electrode of said input transistor being interconnected only to each other; and, (c) means interconnecting the emitter electrode of said output transistor with the collector electrode of said input transistor, said means serving as the common terminal of said composite electrical translating element.

2. A transistor circuit forming a composite electrical translating element having an input electrode, an output electrode and a common electrode, said circuit comprising:

(a) an input transistor having a base electrode, an emitter electrode and a collector electrode, the emitter electrode of said input transistor serving as the input electrode of said composite electrical translating element;

(b) an output transistor having a base electrode, an emitter electrode and a collector electrode, said output transistor being of the opposite conductivity type from said input transistor, the collector electrode of said output transistor serving as the output electrode of said composite electrical translating element, the base electrode of said output transistor being directly connected to the base electrode of said input transistor; and, (c) means directly interconnecting the emitter electrode of said output transistor with the collector electrode of said input transistor, said means serving as the common terminal of said composite electrical translating element.

3. A transistor circuit forming a composite electrical translating element having an input electrode, an output electrode and a common electrode, said circuit comprising:

(a) an input transistor having a base electrode, an emitter electrode and a collector electrode, said input transistor having a current gain within the range of from about five to about fifty, the emitter electrode of said input transistor serving as the input electrode of said composite electrical translating element;

(b) an output transistor having a base electrode, an emitter electrode and a collector electrode, said output transistor being of the opposite conductivity type from said input transistor, the current gain of said output transistor being within the range of from about ten to about five hundred and being at least twice the current gain of said input transistor, the collector electrode of said output transistor serving as the output electrode of said composite electrical translating element, the base electrode of said output transistor being directly connected to the base electrode of said input transistor; and, (c) means directly interconnecting the emitter electrode of said output transistor with the collector electrode of said input transistor, said means serving as the common terminal of said composite electrical translating element.

4. A transistor circuit comprising, in combination:

(a) a signal input terminal;

(b) a signal output terminal;

(c) a signal common terminal;

(d) a first transistor having a base electrode, an emitter electrode and a collector electrode, the emitter electrode of said first transistor being coupled to said signal input terminal;

(e) a second transistor having a base electrode, an emitter electrode and a collector electrode, said second transistor being of opposite conductivity type from said first transistor, the base electrode of said second transistor being coupled to the base electrode of said first transistor, the emitter electrode of said second transistor being coupled to the collector electrode of said first transistor, the collector electrode of said second transistor being coupled to said signal output terminal;

(f) a third transistor having a base electrode, an emitter electrode and a collector electrode, said third transistor being of the same conductivity type as said first transistor, the emitter electrode of said third transistor being coupled to the emitter electrode of said second transistor, the collector electrode of said third transistor being coupled to said signal common terminal; and, (g) a fourth transistor having a base electrode, an emitter electrode and a collector electrode, said fourth transistor being of the opposite conductivity type from said first transistor, the base electrode of said fourth transistor being coupled to the base electrode of said third transistor, the emitter electrode of said fourth transistor being coupled to said signal common terminal, the collector electrode of said fourth transistor being coupled to said signal output terminal.

5. A transistor circuit comprising, in combination:

(a) a signal input terminal;

(b) a signal output terminal;

(c) a signal common terminal;

(d) a first transistor having a base electrode, an emitter electrode and a collector electrode, the emitter electrode of said first transistor being coupled to said signal input terminal;

(e) a second transistor having a base electrode, an emitter electrode and a collector electrode, said second transistor being of the opposite conductivity type from said first transistor, the base electrode of said second transistor being coupled to the base electrode of said first transistor, the emitter electrode of said second transistor being coupled to the collector electrode of said first transistor and to said signal common terminal;

(f) a third transistor having a base electrode, an emitter electrode and a collector electrode, said third transistor being of the same conductivity type as said first transistor, the emitter electrode of said third transistor being coupled to the collector electrode of said second transistor and to a source of direct current operating potential, the collector electrode of said third transistor being coupled to said signal common terminal; and, (g) a fourth transistor having a base electrode, an emitter electrode and a collector electrode, said fourth transistor being of the opposite conductivity type from said first transistor, the base electrode of said fourth transistor being coupled to the base electrode of said third transistor, the emitter electrode of said fourth transistor being coupled to said signal common terminal, the collector electrode of said fourth transistor being coupled to said signal output terminal.

6. A transistor circuit comprising, in combination:

(a) a signal input terminal;

(b) a signal output terminal;

(c) a signal common terminal;

(d) a first transistor having a base electrode, an emitter electrode and a collector electrode, the emitter electrode of said first transistor being coupled to said signal input terminal;

(e) a second transistor having a base electrode, an emitter electrode and a collector electrode, said second transistor being of the opposite conductivity type from said first transistor, the base electrode of said second transistor being coupled to the base electrode of said first transistor, the emitter electrode of said second transistor being coupled to the collector electrode of said first transistor and to said signal common terminal;

(f) a third transistor having a base electrode, an emitter electrode and a collector electrode, said third transistor being of the opposite conductivity type from said first transistor, the emitter electrode of said third transistor being coupled to the collector electrode of said second transistor;

(g) a fourth transistor having a base electrode, an emitter electrode and a collector electrode, said fourth transistor being of the same conductivity type as said first transistor, the base electrode of said fourth transistor being coupled to the base electrode of said third transistor, the emitter electrode of said fourth transistor being coupled to the collector electrode of said third transistor, the collector electrode of said fourth transistor being coupled to said signal common terminal and to said signal output terminal; and, (h) a source of direct current operating potential coupled between said signal common terminal and the emitter electrode of said fourth transistor.

7. A transistor circuit forming a composite electrical translating element having an input electrode, an output electrode and a common electrode, and exhibiting a low pass filter characteristic, said circuit comprising:

(a) an input transistor having a base electrode, an emitter electrode and a collector electrode, the emitter electrode of said input transistor serving as the input electrode of said composite electrical translating element;

(b) an output transistor having a base electrode, an emitter electrode and a collector electrode, said output transistor being of the opposite conductivity type from said input transistor, the collector electrode of said input transistor serving as the output electrode of said composite electrical translating element, the base electrode of said output transistor being coupled to the base electrode of said input transistor;

(c) means interconnecting the emitter electrode of said output transistor with the collector electrode of said input transistor, said means serving as the common terminal of said composite electrical translating element; and, (d) a capacitance coupled between the base and emitter electrodes of said output transistor.

8. A transistor circuit forming a composite electrical translating element having an input electrode, an output electrode and a common electrode, and exhibiting a high-pass filter characteristic, said circuit comprising:

(a) an input transistor having a base electrode, an emitter electrode and a collector electrode, the emitter electrode of said input transistor serving as the input electrode of said composite electrical translating element;

(b) an output transistor having a base electrode, an emitter electrode and a collector electrode, said output transistor being of the opposite conductivity type from said input transistor, the collector electrode of said output transistor serving as the output electrode of said composite electrical translating element, the base electrode of said output transistor being coupled to the base electrode of said input transistor;

(c) means interconnecting the emitter electrode of said output transistor with the collector electrode of said input transistor, said means serving as the common terminal of said composite electrical translating element, and, (d) a capacitance coupled between the base and emitter electrodes of said input transistor.

9. A transistor circuit forming a composite electrical translating element having an input electrode, an output electrode and a common electrode, and exhibiting a band-pass filter characteristic, said circuit comprising:

(a) an input transistor having a base electrode, an emitter electrode and a collector electrode, the emitter electrode of said input transistor serving as the input electrode of said composite electrical translating element;

(b) an output transistor having a base electrode, an emitter electrode and a collector electrode, said output transistor being of the opposite conductivity type from said input transistor, the collector electrode of said output transistor serving as the output electrode of said composite electrical translating element, the base electrode of said output transistor being coupled to the base electrode of said input transistor;

(c) means interconnecting the emitter electrode of said output transistor with the collector electrode of said input transistor, said means serving as the common terminal of said composite electrical translating element; and, (d) a first capacitor coupled between a base and emitter electrodes of said output transistor; and, (e) a second capacitor coupled between the base and emitter electrodes of said input transistor, the capacitance of said second capacitor being a predetermined amount smaller than the capacitance of said first capacitor.

10. A NOR gate circuit comprising, in combination:

(a) a predetermined plurality of signal input terminals;

(b) a signal output terminal;

(c) a first transistor having a base electrode, said predetermined plurality of emitter electrodes and a collector electrode, each of said emitter electrodes being coupled to a different one of said signal input terminals; and, (d) a second transistor having a base electrode, two emitter electrodes and a collector electrode, said second transistor being of the opposite conductivity type from said first transistor, the base electrode of said second transistor being coupled to the base electrode of said first transistor, one of the emitter electrodes of said second transistor being coupled to the base electrode of said second transistor, the other emitter electrode of said second transistor being coupled to the collector electrode of said first transistor, the collector electrode of said second transistor being coupled to the collector electrode of said first transistor, the collector electrode of said second transistor being coupled to said signal output terminal.

11. In a transistor circuit: a first transistor having a base electrode, an emitter electrode and a collector electrode; a second transistor having a base electrode, an emitter electrode and a collector electrode, said second transistor being of the opposite conductivity type from said first transistor; means interconnecting the base electrode of said second transistor to the base electrode of said first transistor; and, direct-current coupling means interconnecting the emitter electrode of said second transistor only with the collector electrode of said first transistor, input signals being applied between the emitter and collector electrodes of said first transistor, output signals appearing between the collector and emitter electrodes of said second transistor.

(References on following page)

References Cited by the Examiner

UNITED STATES PATENTS

| | | | |
|---|---|---|---|
| 2,744,198 | 5/1956 | Raisbeck. | |
| 2,860,260 | 11/1958 | Sykes. | |
| 2,901,638 | 8/1959 | Huang | 307—88.5 |
| 3,178,588 | 4/1965 | Fuller | 307—88.5 |

GEORGE N. WESTBY, *Primary Examiner.*

ARTHUR GAUSS, DAVID J. GALVIN, *Examiners.*

B. P. DAVIS, *Assistant Examiner.*